(12) United States Patent
Fukui et al.

(10) Patent No.: US 7,901,796 B2
(45) Date of Patent: Mar. 8, 2011

(54) COATED CUTTING TOOL AND MANUFACTURING METHOD THEREOF

(75) Inventors: Haruyo Fukui, Itami (JP); Naoya Omori, Itami (JP); Shinya Imamura, Itami (JP); Hideki Moriguchi, Itami (JP); Makoto Setoyama, Itami (JP); Akihiko Shibata, Itami (JP)

(73) Assignee: Sumitomo Electric Hardmetal Corp., Hyogo (JP)

( * ) Notice: Subject to any disclaimer, the term of this patent is extended or adjusted under 35 U.S.C. 154(b) by 743 days.

(21) Appl. No.: 11/794,322

(22) PCT Filed: Dec. 26, 2005

(86) PCT No.: PCT/JP2005/023761
§ 371 (c)(1),
(2), (4) Date: Jun. 28, 2007

(87) PCT Pub. No.: WO2006/070730
PCT Pub. Date: Jul. 6, 2006

(65) Prior Publication Data
US 2007/0269610 A1 Nov. 22, 2007

(30) Foreign Application Priority Data

Dec. 28, 2004 (JP) .................................. 2004-381262
Aug. 31, 2005 (WO) .................. PCT/JP2005/015869

(51) Int. Cl.
*B23B 27/14* (2006.01)
*C23C 14/06* (2006.01)

(52) U.S. Cl. .......... 428/697; 51/307; 51/309; 204/192.1; 204/192.15; 204/192.16; 428/698; 428/699; 428/216; 428/336

(58) Field of Classification Search .................... 51/307, 51/309; 428/697, 698, 699, 701, 702, 704; 204/192.1, 192.15, 192
See application file for complete search history.

(56) References Cited

U.S. PATENT DOCUMENTS 5,580,653 A * 12/1996 Tanaka et al. ................. 428/336
(Continued)

FOREIGN PATENT DOCUMENTS
CN 1362309 8/2002
(Continued)

OTHER PUBLICATIONS

Chinese Office Action, with English Translation, issued in Chinese Patent Application No. CN 200580045233.2, dated Jan. 9, 2009.

*Primary Examiner* — Archene Turner
(74) *Attorney, Agent, or Firm* — McDermott Will & Emery LLP (57) ABSTRACT

A coated cutting tool and its manufacturing method are provided. The coated cutting tool includes a base material and a coating layer formed on a surface of the base material. The coating layer includes an alternate layer having at least one layer of each of an A layer and a B layer stacked one on another alternately. The A layer is made of a nitride containing Al and Cr, and when the total number of metal atoms constituting the A layer is represented as 1, a ratio of the number of Cr atoms is more than 0 and not more than 0.4. The B layer is made of a nitride containing Ti and Al, and when the total number of metal atoms constituting the B layer is represented as 1, a ratio of the number of Al atoms is more than 0 and not more than 0.7.

22 Claims, 5 Drawing Sheets

U.S. PATENT DOCUMENTS

| | | | |
|---|---|---|---|
| 6,660,133 B2 * | 12/2003 | Penich et al. | 204/192.1 |
| 6,767,658 B2 * | 7/2004 | Yamamoto et al. | 428/698 |
| 6,824,601 B2 * | 11/2004 | Yamamoto et al. | 204/192.11 |
| 7,008,688 B2 * | 3/2006 | Toihara | 428/216 |
| 7,166,155 B2 * | 1/2007 | Ishikawa | 428/697 |
| 2002/0132141 A1 | 9/2002 | Toihara | |
| 2002/0168552 A1 | 11/2002 | Yamamoto et al. | |
| 2003/0148145 A1 | 8/2003 | Yamamoto et al. | |
| 2003/0175536 A1 | 9/2003 | Penich et al. | |

FOREIGN PATENT DOCUMENTS

| | | |
|---|---|---|
| JP | 07-310174 | 11/1995 |
| JP | 2002-275618 | 9/2002 |
| JP | 2002-337007 | 11/2002 |
| JP | 2003-034859 | 2/2003 |
| JP | 2003-071611 | 3/2003 |
| JP | 2003-305601 | 10/2003 |
| JP | 2004-169076 | 6/2004 |
| JP | 2005-262388 | 9/2005 |
| JP | 2005-305576 | 11/2005 |
| WO | WO 98/44163 | 10/1998 |
| WO | WO 03/078689 A1 | 9/2003 |

* cited by examiner

COATED CUTTING TOOL AND MANUFACTURING METHOD THEREOF

Related Applications

This application is the U.S. National Phase under 35 U.S.C. §371 of International Application No. PCT/JP2005/023761, filed on Dec. 26, 2005, which in turn claims the benefit of Japanese Application No. 2004-381262, filed on Dec. 28, 2004, and PCT International Application No. PCT/JP2005/015869, filed on Aug. 31, 2005, the disclosures of which Applications are incorporated by reference herein.

TECHNICAL FIELD

The present invention relates to a coated cutting tool and a manufacturing method thereof, and particularly to a coated cutting tool having a long life and a manufacturing method thereof

BACKGROUND ART

Japanese Patent Laying-Open No. 7-310174 (Patent Document 1) discloses a coating layer made of a composition of $(Al_xTi_{1-x-y}Si_y)(N_zC_{1-z})$ (where $0.05 \leq x \leq 0.75$, $0.01 \leq y \leq 0.1$, $0.6 \leq z \leq 1$) that is formed on a surface of a base material made of WC-based hardmetal, cermet, high-speed steel or the like, for the purposes of improving wear resistance and surface protecting function of a coated cutting tool, a wear-resistant tool and others.

As the recent trend of coated cutting tools, however, dry processing using no cutting oil solution has increasingly been demanded from the standpoint of protection of global environment, materials to be cut have been diversified, and cutting speed has further been increased so as to improve processing efficiency. Under these circumstances, the cutting edge of the coated cutting tool tends to be subjected to an increasingly higher temperature during the cutting process, which would result in a shorter life of the coated cutting tool. Thus, the requirements in property of the materials for the coated cutting tools have become more and more severe.

Based on the foregoing, for example, Japanese Patent Laying-Open No.2004-169076 (Patent Document 2) discloses a coating layer made of a composition of $(Al_xCr_{1-x})(N_{1-\alpha-\beta-\gamma}B_\alpha C_\beta O_\gamma)$ (where $0.45 < x < 0.75$, $0 \leq \alpha < 0.12$, $0 \leq \beta < 0.20$, $0.01 \leq \gamma < 0.25$) aiming at improving wear resistance, adhesion and wear resistance. Further, Japanese Patent Laying-Open No.2003-34859 (Patent Document 3) discloses a coating layer made of a composition of $(Al_b, [Cr_{1-\alpha}V_\alpha]_c)(C_{1-d}N_d)$ (where $0.5 \leq b \leq 0.8$, $0.2 \leq c \leq 0.5$, $b+c=1$, $0.05 \leq \alpha \leq 0.95$, $0.5 \leq d \leq 1$) or a composition of $(M_a, Al_b, [Cr_{1-\alpha}V_\alpha]_c)(C_{1-d}N_d)$ (where M is at least one kind selected from the group consisting of Ti, Nb, W, Ta and Mo, $0.02 \leq a \leq 0.3$, $0.5 \leq b \leq 0.8$, $0.05 \leq c$, $a+b+c=1$, $0.5 \leq d \leq 1$, $0 \leq \alpha \leq 1$).

Patent Document 1: Japanese Patent Laying-Open No. 7-310174
Patent Document 2: Japanese Patent Laying-Open No. 2004-169076
Patent Document 3: Japanese Patent Laying-Open No. 2003-34859

DISCLOSURE OF THE INVENTION

Problems to be Solved by the Invention.

In the severe cutting conditions as in the case of performing dry processing with high processing efficiency, it is considered that simply improving the properties of the coating layer such as hardness is insufficient, and that it is very important to suppress exposure of a base material due to chipping of the cutting edge in the early stage of cutting, so as to ensure a long life of the coated cutting tool.

Figure 1:
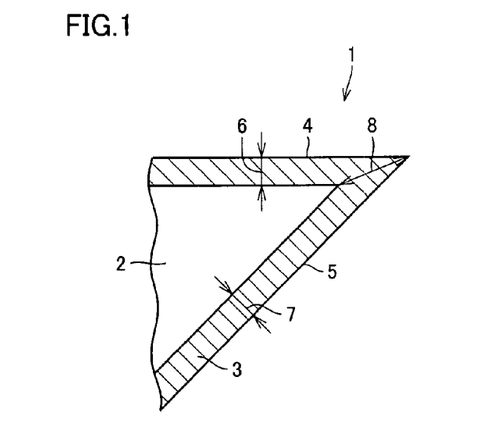
FIG. 1 is a schematic enlarged cross-sectional view of an example of a cutting edge of a coated cutting tool.

FIG. 1 is a schematic enlarged cross-sectional view of a typical cutting edge of a coated cutting tool. In FIG. 1, the coated cutting tool includes a base material 2 and a coating layer 3 formed on the surface of base material 2. The cutting edge of the coated cutting tool is configured with a rake face 4 and a flank 5, which make an acute angle or a right angle in many cases. At such a cutting edge of the coated cutting tool, coating layer 3 has a thickness 8 at the cutting edge ridgeline portion that is greater than its thickness 6 at rake face 4 or its thickness 7 at flank 5.

An ideal wear process of the cutting edge of the coated cutting tool will now be explained with reference to FIG. 2, (a) to (c). The wear of the cutting edge of the coated cutting tool ideally starts as shown in FIG. 2(a), where coating layer 3 is gradually worn away from the cutting edge ridgeline portion. As the wear advances, after it reaches base material 2 as shown in FIG. 2(b), the surfaces of base material 2 and coating layer 3 are both exposed as shown in FIG. 2(c).

Figure 2:
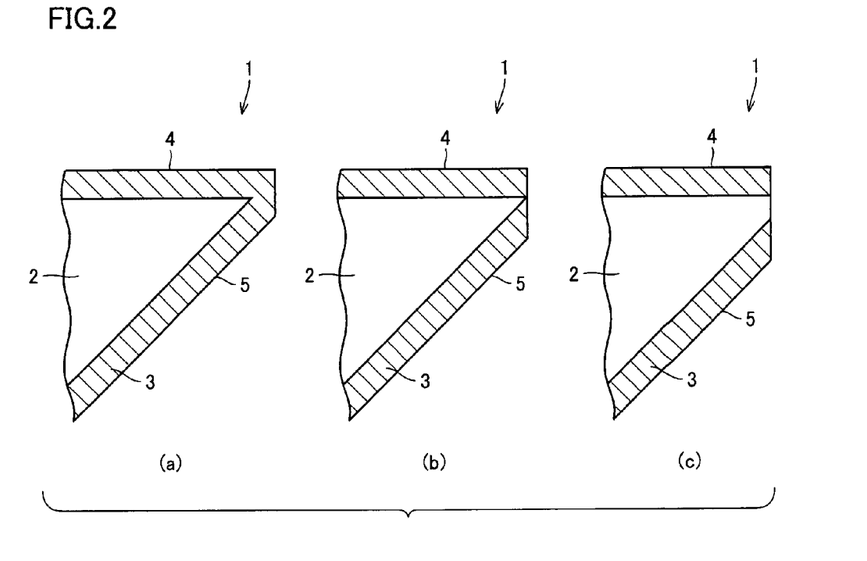
FIG. 2 is a schematic enlarged cross-sectional view showing ideal wear of the cutting edge of the coated cutting tool.
Figure 3:
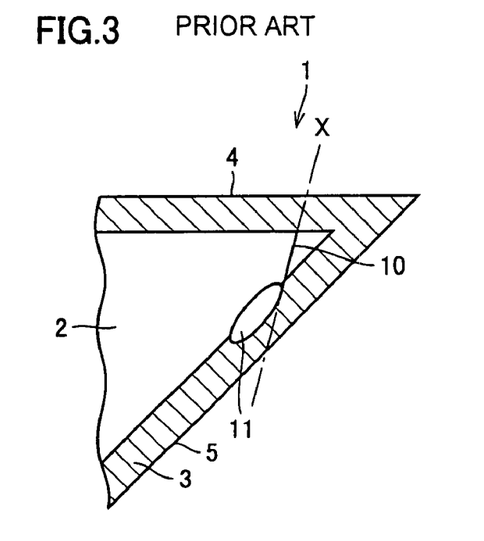
FIG. 3 is a schematic enlarged cross-sectional view showing an example of chipping of a conventional coated cutting tool.

As a result of thorough investigation of the worn portion of the coated cutting tool, however, the inventors have found that wear of the cutting edge at the tip end does not proceed as shown in FIG. 2, (a) to (c). Instead, as shown in FIG. 3, a part of base material 2 is missing already in the early stage of cutting, due to chipping of the cutting edge ridgeline portion as shown by a dashed line X, and the wear of the cutting edge of the coated cutting tool advances from the state where a portion 10 of base material 2 is exposed. An oxidized portion 11 is formed as oxidation advances from the part of base material 2 exposed by the chipping. As such, when base material 2 is exposed in the early stage of cutting, the exposed portion of base material 2 suffers considerable wear during the cutting process, or coating layer 3 will peel off from oxidized portion 11, in which case it would be difficult to ensure a long life of the coated cutting tool.

In view of the foregoing, an object of the present invention is to provide a coated cutting tool having a long life and a manufacturing method thereof Means for Solving the Problems The present invention provides a coated cutting tool including a base material and a coating layer formed on a surface of the base material. The coating layer includes an alternate layer having at least one layer of each of an A layer and a B layer stacked one on another alternately. The A layer is made of a nitride containing Al and Cr, and when the total number of metal atoms constituting the A layer is represented as 1, a ratio of the number of the Cr atoms is more than 0 and not more than 0.4. The B layer is made of a nitride containing Ti and Al, and when the total number of metal atoms constituting the B layer is represented as 1, a ratio of the number of the Al atoms is more than 0 and not more than 0.7.

Here, in the coated cutting tool of the present invention, the B layer may contain a Si element, in which case when the total number of metal atoms constituting the B layer is represented as 1, a ratio of the number of the Si atoms is more than 0 and not more than 0.2.

Further, in the coated cutting tool of the present invention, at least one of the A layer and the B layer may contain a V (vanadium) element in an amount of less than 30 atomic %.

Further, in the coated cutting tool of the present invention, at least one of the A layer and the B layer may contain a B (boron) element in an amount of less than 10 atomic %.

Further, in the coated cutting tool of the present invention, it is preferable that the A layer and the B layer each have a thickness of not less than 0.005 μm and not more than 2 μm.

Further, in the coated cutting tool of the present invention, when a thickness of the A layer and a thickness of the B layer in the alternate layer are represented as λa and λb, respectively, it is preferable that a ratio λa/λb in thickness between the A layer and the B layer satisfies $1 \leq \lambda a/\lambda b < 5$.

Further, in the coated cutting tool of the present invention, when a thickness of the A layer and a thickness of the B layer in the alternate layer are represented as λa and λb, respectively, it is preferable that a ratio λa/λb in thickness between the A layer and the B layer satisfies λa/λb=1 at a side closest to the base material, the value of the ratio λa/λb continuously increases as a distance from the base material increases, and the ratio λa/λb satisfies $1 < \lambda a/\lambda b < 5$ at a side farthest from the base material.

Further, in the coated cutting tool of the present invention, a lowermost layer of the coating layer may be the A layer.

Still further, in the coated cutting tool of the present invention, the A layer serving as the lowermost layer may contain a Si element in an amount of less than 10 atomic %.

Still further, in the coated cutting tool of the present invention, the A layer serving as the lowermost layer preferably has a thickness of not less than 0.1 μm and not more than 2 μm.

Further, in the coated cutting tool of the present invention, a lowermost layer of the coating layer may be the B layer.

Further, in the coated cutting tool of the present invention, an uppermost layer of the coating layer may be a C layer. The C layer may be made of a carbonitride containing Ti and Al, in which case when the total number of metal atoms constituting the C layer is represented as 1, a ratio of the number of the Al atoms is more than 0 and not more than 0.7.

Still further, in the coated cutting tool of the present invention, the C layer may contain a Si element, in which case when the total number of metal atoms constituting the C layer is represented as 1, a ratio of the number of the Si atoms is more than 0 and not more than 0.2.

Still further, in the coated cutting tool of the present invention, the C layer may contain a B element in an amount of less than 10 atomic %.

Still further, in the coated cutting tool of the present invention, the C layer preferably has a thickness of not less than 0.1 μm and not more than 2 μm.

Further, in the coated cutting tool of the present invention, the coating layer preferably has a total thickness of not less than 0.8 μm and not more than 15 μm.

Further, in the coated cutting tool of the present invention, the coating layer preferably has compressive residual stress of not less than 0 GPa and not more than 6 GPa.

Further, in the coated cutting tool of the present invention, the coating layer preferably has a cubic crystal structure.

Further, in the coated cutting tool of the present invention, the base material may be made of at least one kind selected from the group consisting of WC-based hardmetal, cermet, high-speed steel, ceramics, sintered cubic boron nitride, sintered diamond, sintered silicon nitride, aluminum oxide, and titanium carbide.

Further, the coated cutting tool of the present invention may be a drill, an end mill, an indexable insert for milling, an indexable insert for turning, a metal saw, a gear cutting tool, a reamer or a tap.

The present invention further provides a manufacturing method of the coated cutting tool described above, which includes: the step of preparing the base material; and the step of forming the alternate layer by alternately stacking at least one layer of each of the A layer and the B layer by physical vapor deposition.

Here, in the manufacturing method of the coated cutting tool of the present invention, the physical vapor deposition may be at least one kind selected from the group consisting of cathode arc ion plating, balanced magnetron sputtering and unbalanced magnetron sputtering.

The present invention further provides a coated cutting tool including a base material and a coating layer formed on a surface of the base material, wherein the coating layer includes an A layer made of a nitride of $(Al_{1-a}Cr_a)$ (where $0 < a \leq 0.4$) and a B layer made of a nitride of $(Ti_{1-x-y}Al_xSi_y)$ (where $0 < x \leq 0.7$, $0 \leq y \leq 0.2$, $x+y \neq 0$), and at least one layer of each of the A layer and the B layer are stacked alternately.

Further, in the coated cutting tool of the present invention, a lowermost layer of the coating layer may be the A layer.

Further, in the coated cutting tool of the present invention, an uppermost layer of the coating layer may be a C layer made of a carbonitride of $(Ti_{1-x-y}Al_xSi_y)$ (where $0 < x \leq 0.7$, $0 \leq y \leq 0.2$, $x+y \neq 0$).

Effects of the Invention

According to the present invention, it is possible to provide a coated cutting tool having a long life and a manufacturing method thereof

DESCRIPTION OF THE REFERENCE SIGNS

1: coated cutting tool; 2: base material; 3: coating layer; 4: rake face; 5: flank; 6: thickness at rake face; 7: thickness at flank; 8: thickness at cutting edge ridgeline portion; 10: portion; 11: oxidized portion; 12: A layer; 13: alternate layer; 14: C layer; 101: chamber; 103: gas outlet; 104: base material holder; 105: gas; 106, 107, 120: cathode; 108, 109: arc power supply; and 110: bias power supply.

BEST MODES FOR CARRYING OUT THE INVENTION

Hereinafter, embodiments of the present invention will be described. In the drawings, the same reference characters represent the same or corresponding portions.

The coated cutting tool of the present invention includes a base material and a coating layer formed on a surface of the base material. The coating layer includes an alternate layer having at least one layer of each of A and B layers stacked alternately. The A layer is made of a nitride containing Al and Cr. When the total number of metal atoms constituting the A layer is represented as 1, the ratio of the number of Cr atoms is more than 0 and not more than 0.4. The B layer is made of a nitride containing Ti and Al. When the total number of metal atoms constituting the B layer is represented as 1, the ratio of the number of Al atoms is more than 0 and not more than 0.7.

Here, the A layer in the above-described coating layer includes Al, so that it exhibits high oxidation resistance. The A layer includes not only Al but also Cr, so that it exhibits still higher oxidation resistance. Since Al and Cr are combined in the A layer, the A layer tends to have a cubic crystal structure and increased hardness.

Further, the ratio of the number of Cr atoms with respect to the total number of metal atoms constituting the A layer is more than 0 and not more than 0.4. If the ratio of the number of Cr atoms is more than 0.4, hardness of the A layer will decrease. From the standpoint of higher hardness of the A layer, it is more preferable that the ratio of the number of Cr atoms is not less than 0.2 and not more than 0.35. In the present invention, the "metal atoms" refer to atoms of the elements other than hydrogen, helium, neon, argon, krypton, xenon, radon, fluorine, chlorine, bromine, iodine, astatine, oxygen, sulfur, selenium, tellurium, nitrogen, phosphorus, arsenic, antimony, and carbon.

Further, the ratio of the number of Al atoms with respect to the total number of metal atoms constituting the B layer is more than 0 and not more than 0.7. If the ratio of the number of Al atoms in the B layer exceeds 0.7, hardness of the B layer will decrease, leading to accelerated wear. From the standpoint of higher hardness of the B layer, it is more preferable that the ratio of the number of Al atoms in the B layer is not less than 0.3 and not more than 0.65.

Further, the B layer may include silicon as well. Inclusion of silicon in the B layer tends to increase hardness of the B layer and improve oxidation resistance. When silicon is included in the B layer, the ratio of the number of silicon atoms with respect to the total number of metal atoms constituting the B layer is preferably more than 0 and not more than 0.2. If the ratio of the number of silicon atoms is more than 0.2, the B layer tends to become brittle and wear will rather be accelerated. In the case where a target made of an alloy serving as the source of metal of the B layer is to be fabricated by hot isostatic process, if the ratio of the number of silicon atoms is more than 0.2, the target made of the alloy will be broken during baking, so that it may be difficult to obtain material strength adequate for formation of the B layer. From the standpoint of increasing the hardness of the B layer as well as improving the strength of the target made of the alloy, it is more preferable that the ratio of the number of silicon atoms with respect to the total number of metal atoms constituting the B layer is not less than 0.05 and not more than 0.15.

The inventors carried out investigation of layer configurations of various coating films and coating layers for the purpose of improving resistance to chipping of the coating layer formed on the surface of the base material. As a result, they have found that wear resistance and toughness of the coating layer as a whole can be improved when the coating layer includes an alternate layer that is formed by alternately stacking at least one layer of each of the above-described A and B layers different in properties such as compressive residual stress, hardness or the like, and they have thus completed the present invention.

In the coated cutting tool of the present invention, if either the A layer or the B layer alone is formed on the base material, only the properties of the relevant layer, A layer or B layer, will be obtained.

In contrast, when the alternate layer having at least one layer of each of the A and B layers stacked alternately is provided, the properties of the A layer and the properties of the B layer will compensate for each other in the alternate layer, so that the properties of the coating layer may be improved compared to the case of providing the A layer or the B layer alone.

Specifically, assume that the A layer is large in stress and low in hardness, while the B layer is small in stress and high in hardness. In this case, the property of high hardness of the B layer complementarily works with the property of low hardness of the A layer, and the property of small stress of the B layer complementarily works with the property of large stress of the A layer. As such, the A and B layers compensate for their weak properties with each other, and the coating layer exhibits properties considerably superior to those in the case where the A layer and the B layer are simply combined. Elongation of life of the coated cutting tool of the present invention is thus expected.

Further, when the alternate layer having at least one layer of each of the A and B layers stacked alternately is included in the coating layer, if there occurs a crack from the uppermost layer of the coating layer due to chipping during the cutting process or the like, advance of the crack can be suppressed at the interface of the layers in the alternate layer where compositions and crystal lattices are discontinuous. As such, further elongation of life of the coated cutting tool of the present invention is expected.

In the present invention, the number of layers of the A layer and the number of layers of the B layer in the alternate layer refer to the number of layers of the A layer and the number of layers of the B layer constituting the alternate layer. For example, when the alternate layer has a configuration where the A layer, the B layer, the A layer, the B layer and the A layer are stacked in this order, then the number of layers of the A layer and the number of layers of the B layer in the alternate layer are 3 and 2, respectively.

Further, in the present invention, vanadium may be included in at least one of the A and B layers in an amount of less than 30 atomic %. In this case, even if the surface(s) of the A layer and/or the B layer undergoes oxidation in the high-temperature environment at the time of cutting, an oxide of vanadium having a low melting point comes to act as a lubricant during the cutting, and as a result, adhesion of the material having been cut may be suppressed. If vanadium is contained in an amount of 30 atomic % or more, hardness of the A layer and/or the B layer tends to decrease. If vanadium is contained in an amount of less than 15 atomic %, adhesion of the material having been cut can be suppressed and, at the same time, hardness of the A layer and/or the B layer can be increased. In the present invention, the "atomic %" refers to the percentage (%) of the number of atoms with respect to the total number of atoms constituting the layer.

Further, in the present invention, boron may be included in at least one of the A and B layers in an amount of less than 10 atomic %. In this case, hardness of the layer tends to further increase, although the mechanism is not known. It is also advantageous in that an oxide of boron, formed by surface oxidation during the cutting process, tends to compact particularly an oxide of Al within the layer. Furthermore, an oxide of boron, having a low melting point, acts as a lubricant during the cutting process, which may suppress adhesion of the material having been cut.

It is preferable that the A layer and the B layer each have a thickness of not less than 0.005 μm and not more than 2 μm. This tends to suppress advance of the crack generated at the surface of the coating layer. If the A layer and the B layer each have the thickness of less than 0.005 μm, the layers will be mixed with each other, in which case the effect expected by alternately stacking the A and B layers may not be obtained. If they each have the thickness of more than 2 μm, the effect of further suppressing the advance of the crack may not be obtained.

Figure 9:
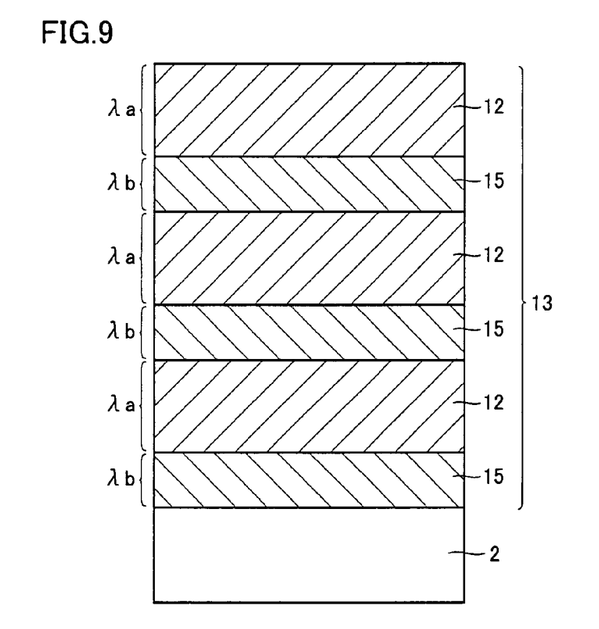
FIG. 9 is a schematic enlarged cross-sectional view of an example of the coated cutting tool of the present invention.

Further, as shown in a schematic cross sectional view of FIG. 9, when $\lambda a$ and $\lambda b$ represent the thicknesses of the A layer 12 and the B layer 15, respectively, in the alternate layer 13, the ratio $\lambda a/\lambda b$ in thickness between A layer 12 and B layer 15 satisfies preferably $1 \leq \lambda a/\lambda b < 5$, and more preferably $1 \leq \lambda a/\lambda b < 3$. The A layer not only exhibits high oxidation resistance as described above, but also has a low degree of heat conductivity, so that it would not easily conduct the heat occurred upon cutting to the base material. As such, if the ratio of the A layer within the coating layer relatively increases, heat resistance of the coated cutting tool as a whole improves. This leads particularly to improvement in wear resistance of the coated cutting tool upon continuous cutting. Since the amount of Ti within the coating layer relatively decreases, adhesion of the Ti alloy to the damaged portion of the coated cutting tool at the time of cutting of the Ti alloy, for example, is restricted, which is likely to elongate the life of the coated cutting tool. If $\lambda a/\lambda b < 1$, oxidation resistance of the coating layer tends to decrease. If $\lambda a/\lambda b > 5$, the effect of suppressing advance of the crack by stacking the A layer and the B layer may not be obtained.

Figure 10:
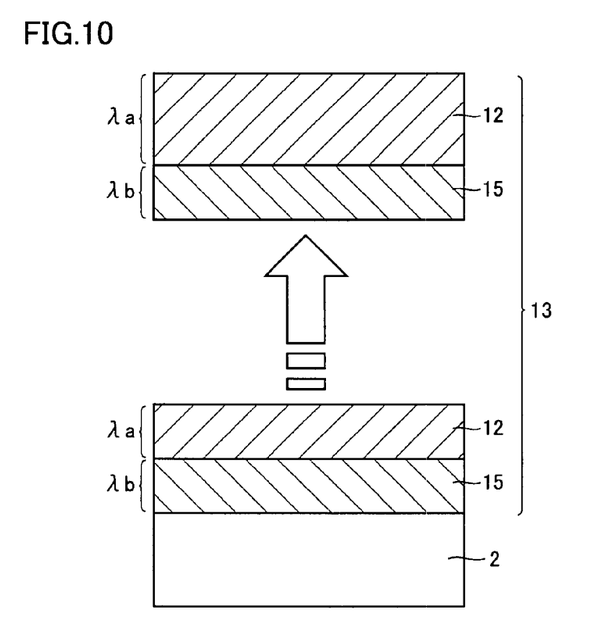
FIG. 10 is a schematic enlarged cross-sectional view of another example of the coated cutting tool of the present invention.

Furthermore, as shown in a schematic cross sectional view of FIG. 10, when $\lambda a$ and $\lambda b$ represent the thicknesses of A layer 12 and B layer 15, respectively, in alternate layer 13, it is preferable that the ratio $\lambda a/\lambda b$ in thickness between A layer 12 and B layer 15 satisfies $\lambda a/\lambda b = 1$ at the side closest to base material 2, and the value of $\lambda a/\lambda b$ continuously increases as the distance from base material 2 increases. At the side farthest from base material 2, the ratio preferably satisfies $1 < \lambda a/\lambda b < 5$, and more preferably $1 < \lambda a/\lambda b < 3$. The A layer not only has good oxidation resistance as described above, but also has a low degree of heat conductivity, so that it would not easily conduct the heat generated upon cutting to the base material. As such, if the ratio of the A layer within the coating layer relatively increases, heat resistance of the coated cutting tool as a whole improves. This leads particularly to improvement in wear resistance of the coated cutting tool upon continuous cutting. From the standpoint of adhesion of the coating layer, however, it is effective to alternately stack the B layer that is low in stress. Accordingly, at the side closest to the base material, the ratio of the B layer is increased, while the ratio of the A layer is continuously increased as the distance from the base material increases, which can improve the performance at the time of interrupted cutting during which load is imposed on the cutting edge. Further, since the amount of Ti in the coating layer relatively decreases as the distance from the base material increases, adhesion of the Ti alloy to the damaged portion of the coated cutting tool at the time of cutting of the Ti alloy, for example, is restricted, which is likely to elongate the life of the coated cutting tool. If $\lambda a/\lambda b < 1$ at the side farthest from the base material, oxidation resistance of the coating layer is likely to decrease. If $\lambda a/\lambda b > 5$, the effect of suppressing advance of the crack by stacking the A and B layers may not be obtained.

In the present invention, the lowermost layer of the coating layer may be the A layer. Here, the lowermost layer refers to one of the layers within the coating layer that comes into direct contact with the base material. When the lowermost layer of the coating layer is the A layer, even if the base material is exposed in the early stage of the cutting process, oxidation from the interface between the base material and the coating layer tends to be suppressed. It is noted that, when the alternate layer is to be formed on the lowermost A layer, either the A layer or the B layer may be stacked immediately on the lowermost A layer.

Further, the A layer serving as the lowermost layer of the coating layer may include Si in an amount of less than 10 atomic %. This tends to increase hardness of the A layer as the lowermost layer, and its structure is likely to become finer.

The A layer serving as the lowermost layer of the coating layer preferably has a thickness of not less than 0.1 μm and not more than 2 μm. If it is less than 0.1 μm, the effect expected by providing the A layer as the lowermost layer of the coating layer may not be obtained. If it exceeds 2 μm, further improvement of the effect obtained by providing the A layer as the lowermost layer of the coating layer may not be expected.

In the present invention, the lowermost layer of the coating layer may be the B layer. When the B layer is provided as the lowermost layer of the coating layer, by virtue of small stress of the B layer, resistance to peeling of the coating layer tends to considerably increase particularly in the case of interrupted processing such as milling or end milling where the load is repeatedly applied to the cutting edge. When the total number of metal atoms constituting the B layer serving as the lowermost layer is represented as 1, it is preferable that the ratio of the number of Al atoms within the B layer is more than 0.3 and not more than 0.55 from the standpoint of improvement of the resistance to peeling. Furthermore, in the case where the alternate layer is to be formed on the lowermost B layer, either the A layer or the B layer may be stacked on the B layer.

In the present invention, the uppermost layer of the coating layer may be a C layer. Here, the C layer is made of a carbonitride (compound containing carbon and nitrogen) including Ti and Al, and when the total number of metal atoms constituting the C layer is represented as 1, the ratio of the number of Al atoms is more than 0 and not more than 0.7. Further, the C layer may include silicon. When the C layer includes silicon, the ratio of the number of silicon atoms with respect to the total number of metal atoms constituting the C layer is more than 0 and not more than 0.2. Provision of the C layer as the uppermost layer of the coating layer tends to decrease the coefficient of friction of the coating layer with respect to the material to be cut, which may contribute to elongation of life of the coated cutting tool of the present invention. In general, a carbonitride tends to have a lower coefficient of friction than a nitride with respect to the material to be cut. Such a decrease of the coefficient of friction is considered to be attributable to the carbon atoms. Further, the surface of the C layer is subjected to a higher temperature than the surfaces of any other layers during the cutting process. Thus, in the present invention, the C layer is made to have the composition as described above so as to ensure oxidation resistance. From the standpoint of improvement of the oxidation resistance, it is more preferable that the above-described ratio of the number of Al atoms in the C layer is not less than 0.3 and not more than 0.65, and the above-described ratio of the number of silicon atoms is not less than 0.05 and not more than 0.15.

The C layer may also include boron in an amount of less than 10 atomic %. In this case, hardness of the layer tends to further increase, although the mechanism is not known. Furthermore, the same is also preferable since an oxide of boron formed by surface oxidation during the cutting process may compact particularly an oxide of Al within the layer. Still further, an oxide of boron having a low melting point tends to act as a lubricant during the cutting process, which may suppress adhesion of the material having been cut.

It is preferable that the C layer has a thickness of not less than 0.1 µm and not more than 2 µm. If the thickness of the C layer is less than 0.1 µm, the effect expected by providing lubricity to the outermost layer of the coating layer may not be obtained. If it exceeds 2 µm, further improvement of the relevant effect may not be expected.

Further, the C layer may be provided with a certain color by adjusting the composition ratio between nitrogen and carbon. This can add some design to the appearance of the coated cutting tool of the present invention, which is commercially useful.

In the present invention, the coating layer preferably has an overall thickness of not less than 0.8 µm and not more than 15 µm. If the total thickness of the coating layer is less than 0.8 µm, it is too thin, possibly leading to a shorter life of the coated cutting tool of the present invention. If it is thicker than 15 µm, the coating layer tends to suffer chipping in the early stage of the cutting process, again leading to a shorter life of the coated cutting tool of the present invention.

It is noted, in the present invention, the thicknesses of the respective layers described above and the thickness of the coating layer as a whole may be obtained by cutting the coated cutting tool of the present invention and by analyzing the cross section using a scanning electron microscope (SEM) or a transmission electron microscope (TEM).

In the present invention, the coating layer preferably has compressive residual stress of not less than 0 GPa and not more than 6 GPa. If it is less than 0 GPa, it becomes tensile stress, in which case advance of the crack generated from the outermost surface of the coating layer may not be suppressed. If it exceeds 6 GPa, the stress is too large, in which case the coating layer may peel off particularly from the edge part of the coated cutting tool prior to initiation of the cutting process, possibly leading to a shortened life of the coated cutting tool. In the present invention, the compressive residual stress of the coating layer refers to the compressive residual stress of the coating layer as a whole.

In the present invention, the coating layer preferably has a cubic crystal structure. When the coating layer has the cubic crystal structure, hardness of the coating layer tends to increase. For example, taking an example of a nitride, AlN, it normally has a hexagonal crystal structure. It has a lattice constant of 0.412 nm in the case of a cubic crystal structure of metastable phase. Meanwhile, CrN and VN, where the cubic crystal structure is the stable phase at room temperature and normal pressure, have the lattice constant of 0.414 nm, which is very close to the lattice constant of AlN of the cubic crystal structure. As such, with the drawing effect thereof, AlN attains the cubic crystal structure and increases in hardness. Each of the layers in the coating layer preferably has the cubic crystal structure. The crystal structures of the coating layer and of the respective layers within the coating layer may be analyzed using an X-ray diffractometer known in the art.

In the present invention, as the base material, at least one kind selected from the group consisting of WC-based hardmetal, cermet, high-speed steel, ceramics, sintered cubic boron nitride, sintered diamond, sintered silicon nitride, aluminum oxide, and titanium carbide may be employed.

The coated cutting tool of the present invention may be utilized, e.g., as a drill, an end mill, an indexable insert for milling, an indexable insert for turning, a metal saw, a gear cutting tool, a reamer, or a tap.

Figure 4:
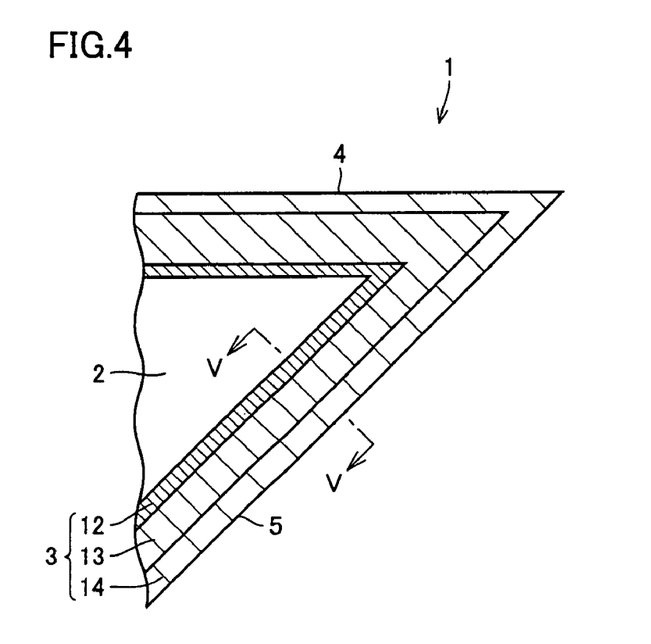
FIG. 4 is a schematic enlarged cross-sectional view of a cutting edge according to an example of a coated cutting tool of the present invention.

FIG. 4 is a schematic enlarged cross-sectional view of a cutting edge of an example of a coated cutting tool of the present invention. The coated cutting tool 1 of the present invention includes a base material 2, an A layer 12 serving as a lowermost layer that is stacked on base material 2, an alternate layer 13 having A and B layers stacked alternately on the lowermost A layer 12, and a C layer 14 serving as an uppermost layer stacked on alternate layer 13. A coating layer 3 is configured with the lowermost A layer 12, alternate layer 13, and the uppermost C layer 14.

Here, the uppermost C layer 14 has a low coefficient of friction with respect to a material to be cut. This makes the cutting edge slippery against the material to be cut during the cutting process, and thus, coating layer 3 tends to be worn away without suffering chipping. When A layer 12 is provided as the lowermost layer in contact with base material 2, oxidation from the base material 2 side can be suppressed, and good adhesion between base material 2 and coating layer 3 can be maintained even after wear advances. Provision of alternate layer 13 excellent in wear resistance and toughness between the lowermost A layer 12 and the uppermost C layer 14 can elongate the life of coated cutting tool 1 of the present invention.

Figure 5:
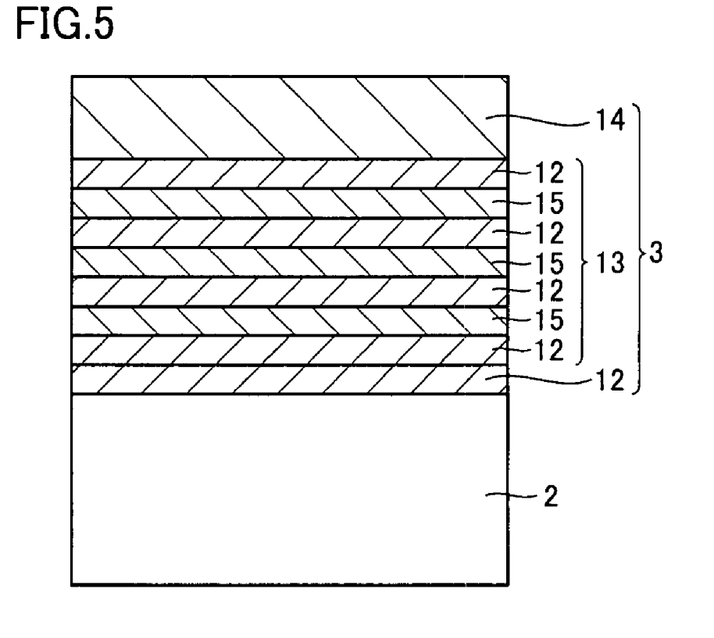
FIG. 5 is a schematic enlarged cross-sectional view taken along the line V-V in FIG. 4.

FIG. 5 is a schematic enlarged cross-sectional view taken along the line V-V shown in FIG. 4. Here, alternate layer 13 has A layers 12 and B layers 15 stacked alternately on the lowermost A layer 12. In alternate layer 13, four A layers 12 and three B layers 15 are stacked.

Here, as A layer 12, a nitride of $(Al_{1-a}Cr_a)$ (where $0<a\leq 0.4$), for example, may be employed. As B layer 15, a nitride of $(Ti_{1-x-y}Al_xSi_y)$ (where $0<x\leq 0.7$, $0\leq y\leq 0.2$, $x+y\neq 0$), for example, may be employed. As C layer 14, a carbonitride of $(Ti_{1-x-y}Al_xSi_y)$ (where $0<x\leq 0.7$, $0\leq y\leq 0.2$, $x+y\neq 0$), for example, may be employed.

Figure 6:
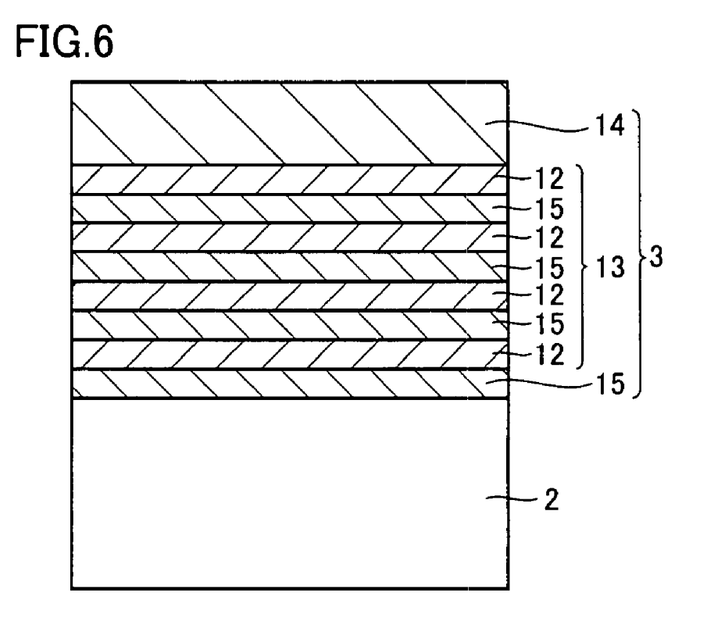
FIG. 6 is a schematic enlarged cross-sectional view of another example of the coated cutting tool of the present invention.

FIG. 6 is a schematic enlarged cross-sectional view of another example of the coated cutting tool of the present invention, which is characterized in that B layer 15 is used as the lowermost layer of coating layer 3. When B layer 15 is used as the lowermost layer, resistance to peeling between base material 2 and coating layer 3 can be improved by virtue of small stress of B layer 15, as described above.

Here, as the lowermost B layer 15 shown in FIG. 6, a nitride of $(Ti_{1-x-y}Al_xSi_y)$ (where $0.3<x<0.5$, $0\leq y\leq 0.2$, $x+y\neq 0$) having a thickness of not less than 0.3 µm and not more than 0.5 µm, for example, may be employed. As alternate layer 13 shown in FIG. 6, the layer having A layer 12 made of a nitride of $(Al_{1-a}Cr_a)$ (where $0.2<a<0.4$) and B layer 15 made of a nitride of $(Ti_{1-x-y}Al_xSi_y)$ (where $0.3<x<0.5$, $0\leq y\leq 0.2$, $x+y\neq 0$) stacked alternately, for example, may be employed. Here, the total number of A layers 12 and B layers 15 constituting alternate layer 13 may be set to not less than 640 layers and not more than 1000 layers, for example. The thickness of alternate layer 13 as a whole may be set to not less than 2 µm and not more than 6 µm, for example. Further, as the uppermost C layer 14 shown in FIG. 6, a carbonitride of $(Ti_{1-x-y}Al_xSi_y)$ (where $0<x\leq 0.7$, $0\leq y\leq 0.2$, $x+y\neq 0$) having a thickness of not less than 0.1 µm and not more than 0.5 µm, for example, may be employed.

The coated cutting tool of the present invention may be manufactured with a method including the step of preparing a base material, and the step of forming an alternate layer by alternately stacking at least one layer of each of A layer and B layer by physical vapor deposition. Here, as the physical vapor deposition, at least one kind selected from the group consisting of cathode arc ion plating, balanced magnetron sputtering and unbalanced magnetron sputtering may be employed.

In the present invention, for the purpose of forming a coating layer having wear resistance on a surface of a base material, it is preferable to form a layer from a compound having high crystallinity. Through investigation of various methods for forming the coating layer, it has been found that it is preferable to use the physical vapor deposition. While the physical vapor deposition includes the cathode arc ion plating, the balanced magnetron sputtering, the unbalanced magnetron sputtering and the like, the cathode arc ion plating having a high ionization rate of source element is particularly suitable. When the cathode arc ion plating is employed, metal ion bombardment processing on the surface of the base material becomes possible prior to formation of the coating layer. This is advantageous in that adhesion between the base material and the coating layer improves significantly.

Here, the cathode arc ion plating can be carried out for example as follows. A base material is arranged in an apparatus. A target serving as a cathode is also arranged, and a high voltage is applied to the target to cause arc discharge, to thereby ionize and evaporate the atoms constituting the target. The material is thus deposited on the base material.

The balanced magnetron sputtering can be carried out for example as follows. A base material is arranged in an apparatus. In the apparatus, a target is also arranged on a magnetron electrode provided with a magnet forming a balanced magnetic field. A high-frequency power is applied between the magnetron electrode and the base material to generate gas plasma. Gas ions caused by generation of the gas plasma are made to impinge on the target, so that the atoms released from the target are deposited on the base material.

Further, the unbalanced magnetron sputtering can be carried out by causing an unbalanced magnetic field to be generated by the magnetron electrode in the above-described balanced magnetron sputtering.

EXAMPLES

Examples 1-18

Figure 7:
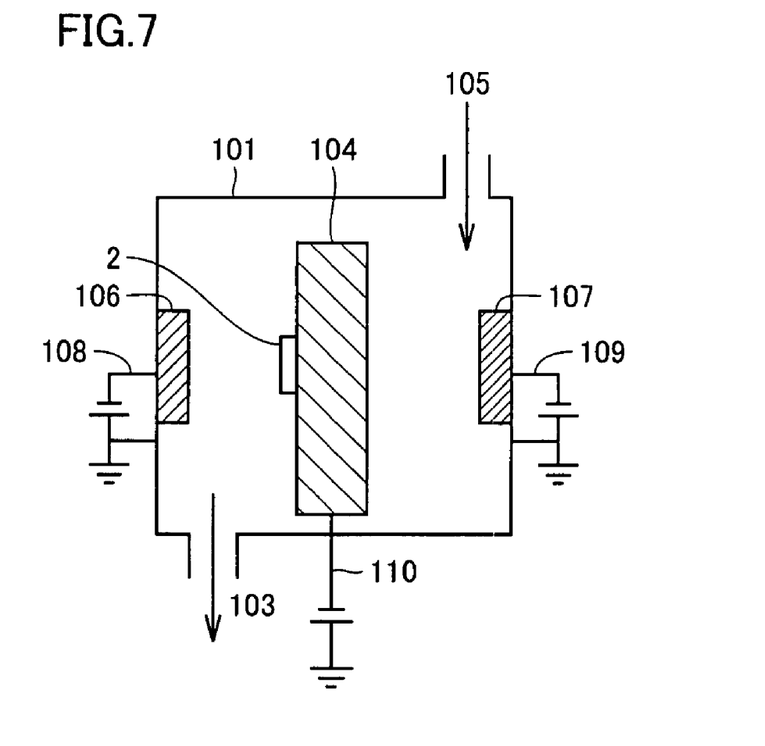
FIG. 7 is a schematic cross-sectional view of a cathode arc ion plating apparatus used in an embodiment.
Figure 8:
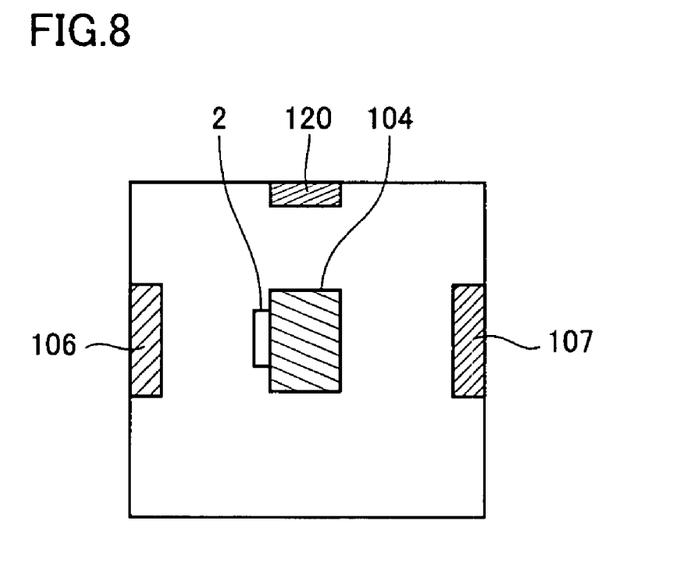
FIG. 8 is a schematic top plan view of the cathode arc ion plating apparatus shown in FIG. 7.

<Fabrication of Coated Cutting Tool>
(1) Cleaning of Base Material
In a cathode arc ion plating apparatus as shown in FIG. 7, a tip made of hardmetal of a grade of JIS standard P30 and having a shape of JIS standard SPGN 120308 was mounted as base material 2. FIG. 8 is a schematic top plan view of the apparatus in FIG. 7.

In the apparatus shown in FIGS. 7 and 8, a cathode 106 for the A layer, a cathode 107 for the B layer, and a cathode 120 for the C layer, which are targets made of alloys serving as the sources of metals of the coating layer, and a rotary-type base material holder 104 for placing base material 2 are set in a chamber 101. An arc power supply 108 is attached to cathode 106, and an arc power supply 109 is attached to cathode 107. A bias power supply 110 is attached to base material holder 104. Further provided in chamber 101 are a gas inlet through which gas 105 is introduced therein, and a gas outlet 103 for adjusting the pressure within chamber 101. The apparatus is configured such that the gas within chamber 101 can be sucked by a vacuum pump via gas outlet 103.

In the apparatus of FIG. 7, firstly, the pressure within chamber 101 was reduced by means of the vacuum pump, and the temperature was increased to 500° C. using a heater provided in the apparatus, with base material 2 being rotated. The chamber was evacuated until the pressure within chamber 101 became $1.0 \times 10^{-4}$ Pa. Next, argon gas was introduced via the gas inlet, and the pressure within chamber 101 was held at 3.0 Pa. The voltage of bias power supply 110 was gradually increased to −1000 V, and the surface of base material 2 was cleaned for 15 minutes. Thereafter, the argon gas was evacuated from within chamber 101.

(2) Formation of Coating Layer
Next, with base material 2 being rotated at the center, the lowermost layer and the alternate layer having the compositions as shown in Table 1 were formed. Specifically, while introducing nitrogen as the reactive gas, and with the temperature of base material 2 maintained at 500° C., the pressure of the reactive gas maintained at 2.0 Pa, and the voltage of bias power supply 110 maintained at a certain value in a range from −50 V to −200 V, the arc current of 100 A was supplied to each of cathodes 106 and 107 to generate metal ions therefrom, to thereby form the lowermost layer and the alternate layer of Examples 1-18 in Table 1. Here, the alternate layer was formed by alternately stacking one layer of each of the A and B layers by the numbers of stacked layers shown in Table 1 on the lowermost layer. Further, the thickness of the lowermost layer as well as the thicknesses and the numbers of stacked layers of the A and B layers in the alternate layer were adjusted with the speed of rotation of the base material. The current supply to the evaporation sources was stopped when the lowermost layer and the alternate layer achieved the thicknesses as shown in Table 1.

Subsequently, the C layer serving as the uppermost layer was formed in each of Examples 1-18 with the composition shown in Table 2. Here, while introducing nitrogen and methane gas into chamber 101 as the reactive gas, with the temperature of base material 2 maintained at 400° C., the pressure of the reactive gas maintained at 2.0 Pa, and the voltage of bias power supply 110 maintained at −350 V, the arc current of 100 A was supplied to cathode 120 to cause metal ions to be generated from cathode 120, to thereby form the uppermost layer in each of Examples 1-18 in Table 2. The current supply to the evaporation source was stopped when the thickness of the uppermost layer attained the thickness shown in Table 2. The ratio between nitrogen and carbon in the composition of the uppermost layer shown in Table 2 was adjusted by the ratio between the introduced amount of nitrogen and the introduced amount of methane gas. In this manner, the indexable inserts of Examples 1-18 were fabricated.

As comparative examples, indexable inserts of Comparative Examples 1-3 were fabricated as well, in each of which the layer of the composition shown in Table 1 was formed on the base material the same as that of each of Examples 1-18.

<Evaluation of Life of Coated Cutting Tool>
Each of the indexable inserts of Examples 1-18 fabricated through the above-described steps was subjected to a dry continuous turning test and a dry interrupted turning test under the conditions shown in Table 3, to measure the flank wear amount at the cutting edge. The life evaluation results are shown in Table 2. In Table 2, as the flank wear amount is smaller, the life is longer.

TABLE 1

| | Lowermost Layer | | A layer | | | | B layer | | |
|---|---|---|---|---|---|---|---|---|---|
| | Composition | Thickness (μm) | Composition | Thickness per layer (μm) | Number of stacked layers | Thickness (μm) | Composition | Thickness per layer (μm) | Number of stacked layers | Thickness (μm) |
| Ex 1 | $Al_{0.7}Cr_{0.3}N$ | 0.5 | $Al_{0.7}Cr_{0.3}N$ | 1 | 1 | 1 | $Ti_{0.5}Al_{0.5}N$ | 1 | 1 | 1 |
| Ex 2 | $Al_{0.7}Cr_{0.3}N$ | 0.5 | $Al_{0.7}Cr_{0.3}N$ | 1 | 1 | 1 | $Ti_{0.35}Al_{0.65}N$ | 1 | 1 | 1 |
| Ex 3 | $Al_{0.7}Cr_{0.3}N$ | 0.5 | $Al_{0.7}Cr_{0.3}N$ | 1 | 1 | 1 | $Ti_{0.7}Al_{0.3}N$ | 1 | 1 | 1 |
| Ex 4 | $Al_{0.8}Cr_{0.2}N$ | 0.5 | $Al_{0.8}Cr_{0.2}N$ | 1 | 1 | 1 | $Ti_{0.35}Al_{0.65}N$ | 1 | 1 | 1 |
| Ex 5 | $Al_{0.4}Cr_{0.6}N$ | 0.5 | $Al_{0.4}Cr_{0.6}N$ | 1 | 1 | 1 | $Ti_{0.35}Al_{0.65}N$ | 1 | 1 | 1 |
| Ex 6 | $Al_{0.7}Cr_{0.3}N$ | 0.5 | $Al_{0.7}Cr_{0.3}N$ | 0.1 | 10 | 1 | $Ti_{0.5}Al_{0.5}N$ | 0.1 | 10 | 1 |
| Ex 7 | $Al_{0.7}Cr_{0.3}N$ | 0.5 | $Al_{0.7}Cr_{0.3}N$ | 0.02 | 50 | 1 | $Ti_{0.5}Al_{0.5}N$ | 0.02 | 50 | 1 |
| Ex 8 | $Al_{0.7}Cr_{0.3}N$ | 0.5 | $Al_{0.7}Cr_{0.3}N$ | 0.007 | 150 | 1 | $Ti_{0.5}Al_{0.5}N$ | 0.007 | 150 | 1 |
| Ex 9 | $Al_{0.7}Cr_{0.3}N$ | 0.5 | $Al_{0.7}Cr_{0.3}N$ | 0.5 | 4 | 2 | $Ti_{0.5}Al_{0.5}N$ | 0.5 | 4 | 2 |
| Ex 10 | $Al_{0.7}Cr_{0.3}N$ | 0.5 | $Al_{0.7}Cr_{0.3}N$ | 0.5 | 12 | 6 | $Ti_{0.5}Al_{0.5}N$ | 0.5 | 12 | 6 |
| Ex 11 | $Al_{0.7}Cr_{0.3}N$ | 0.2 | $Al_{0.7}Cr_{0.3}N$ | 0.02 | 4 | 0.08 | $Ti_{0.5}Al_{0.5}N$ | 0.02 | 4 | 0.08 |
| Ex 12 | $Al_{0.7}Cr_{0.3}N$ | 0.5 | $Al_{0.7}Cr_{0.3}N$ | 0.02 | 50 | 1 | $Ti_{0.4}Al_{0.5}Si_{0.1}N$ | 0.02 | 50 | 1 |
| Ex 13 | $Al_{0.7}Cr_{0.3}N$ | 0.5 | $Al_{0.7}Cr_{0.3}N$ | 0.02 | 50 | 1 | $Ti_{0.45}Al_{0.5}B_{0.05}N$ | 0.02 | 50 | 1 |
| Ex 14 | $Al_{0.7}Cr_{0.25}Si_{0.05}N$ | 0.5 | $Al_{0.7}Cr_{0.25}Si_{0.05}N$ | 0.5 | 4 | 2 | $Ti_{0.5}Al_{0.5}N$ | 0.5 | 4 | 2 |
| Ex 15 | $Al_{0.7}Cr_{0.2}V_{0.1}N$ | 0.5 | $Al_{0.7}Cr_{0.2}V_{0.1}N$ | 0.5 | 4 | 2 | $Ti_{0.5}Al_{0.5}N$ | 0.5 | 4 | 2 |
| Ex 16 | $Ti_{0.6}Al_{0.4}N$ | 0.5 | $Al_{0.7}Cr_{0.3}N$ | 0.005 | 320 | 1.6 | $Ti_{0.6}Al_{0.4}N$ | 0.005 | 320 | 1.6 |
| Ex 17 | $Ti_{0.55}Al_{0.45}N$ | 0.5 | $Al_{0.7}Cr_{0.3}N$ | 0.004 | 320 | 1.3 | $Ti_{0.55}Al_{0.45}N$ | 0.004 | 320 | 1.3 |
| Ex 18 | $Ti_{0.6}Al_{0.4}N$ | 0.5 | $Al_{0.73}Cr_{0.27}N$ | 0.006 | 250 | 1.5 | $Ti_{0.6}Al_{0.4}N$ | 0.006 | 250 | 1.5 |
| Com. Ex 1 | TiN | 0.5 | $Ti_{0.5}Al_{0.5}N$ | 2.7 | 1 | 2.7 | — | — | — | — |
| Com. Ex 2 | TiN | 0.5 | $Al_{0.7}Cr_{0.3}N$ | 2.7 | 1 | 2.7 | — | — | — | — |
| Com. Ex 3 | TiN | 0.5 | $Ti_{0.5}Al_{0.5}C_{0.4}N_{0.6}$ | 2.7 | 1 | 2.7 | — | — | — | — |

TABLE 2

| | Uppermost layer | | Entire coating layer | | | | Flank wear amount (mm) | |
|---|---|---|---|---|---|---|---|---|
| | Composition | Thickness (μm) | Thickness (μm) | Hardness (GPa) | Compressive residual stress (GPa) | Crystallinity | Continuous Cutting | Interrupted cutting |
| Ex 1 | $Ti_{0.5}Al_{0.5}C_{0.4}N_{0.6}$ | 0.7 | 3.2 | 29 | 2.1 | cubic | 0.083 | 0.083 |
| Ex 2 | $Ti_{0.5}Al_{0.5}C_{0.4}N_{0.6}$ | 0.7 | 3.2 | 34 | 2.6 | cubic | 0.077 | 0.071 |
| Ex 3 | $Ti_{0.5}Al_{0.5}C_{0.4}N_{0.6}$ | 0.7 | 3.2 | 28 | 1.5 | cubic | 0.079 | 0.080 |
| Ex 4 | $Ti_{0.5}Al_{0.5}C_{0.4}N_{0.6}$ | 0.7 | 3.2 | 27 | 2.1 | cubic | 0.088 | 0.087 |
| Ex 5 | $Ti_{0.5}Al_{0.5}C_{0.4}N_{0.6}$ | 0.7 | 3.2 | 28 | 2.8 | cubic | 0.095 | 0.093 |
| Ex 6 | $Ti_{0.5}Al_{0.5}C_{0.4}N_{0.6}$ | 0.7 | 3.2 | 32 | 2.7 | cubic | 0.072 | 0.066 |
| Ex 7 | $Ti_{0.5}Al_{0.5}C_{0.4}N_{0.6}$ | 0.7 | 3.2 | 34 | 3.3 | cubic | 0.069 | 0.063 |
| Ex 8 | $Ti_{0.5}Al_{0.5}C_{0.4}N_{0.6}$ | 0.7 | 3.2 | 31 | 3.1 | cubic | 0.070 | 0.071 |
| Ex 9 | $Ti_{0.5}Al_{0.5}C_{0.4}N_{0.6}$ | 0.7 | 5.2 | 28 | 2.8 | cubic | 0.062 | 0.063 |
| Ex 10 | $Ti_{0.5}Al_{0.5}C_{0.4}N_{0.6}$ | 0.7 | 13.2 | 35 | 5.8 | cubic | 0.065 | 0.061 |
| Ex 11 | $Ti_{0.5}Al_{0.5}C_{0.4}N_{0.6}$ | 0.5 | 0.9 | 30 | 0.5 | cubic | 0.105 | 0.111 |
| Ex 12 | $Ti_{0.4}Al_{0.5}Si_{0.1}C_{0.4}N_{0.6}$ | 0.7 | 3.2 | 41 | 3.0 | cubic | 0.052 | 0.050 |
| Ex 13 | $Ti_{0.45}Al_{0.5}B_{0.05}C_{0.4}N_{0.6}$ | 0.7 | 3.2 | 38 | 2.9 | cubic | 0.051 | 0.048 |
| Ex 14 | $Ti_{0.5}Al_{0.5}C_{0.4}N_{0.6}$ | 0.7 | 5.2 | 33 | 4.3 | cubic | 0.061 | 0.060 |
| Ex 15 | $Ti_{0.5}Al_{0.5}C_{0.4}N_{0.6}$ | 0.7 | 5.2 | 32 | 4.2 | cubic | 0.063 | 0.060 |
| Ex 16 | $Ti_{0.6}Al_{0.4}C_{0.4}N_{0.6}$ | 0.7 | 4.4 | 33 | 3.4 | cubic | 0.071 | 0.035 |
| Ex 17 | $Ti_{0.55}Al_{0.45}C_{0.3}N_{0.7}$ | 0.7 | 3.8 | 35 | 3.6 | cubic | 0.070 | 0.033 |
| Ex 18 | $Ti_{0.6}Al_{0.4}C_{0.4}N_{0.6}$ | 0.9 | 4.4 | 33 | 3.4 | cubic | 0.068 | 0.028 |
| Com Ex 1 | — | — | 3.2 | 28 | 2.5 | cubic | 0.350 | 0.310 |
| Com Ex 2 | — | — | 3.2 | 34 | 4.2 | cubic | 0.280 | chipped |
| Com Ex 3 | — | — | 3.2 | 30 | 1.2 | cubic | chipped | chipped |

TABLE 3

| | Continuous cutting | Interrupted cutting |
|---|---|---|
| Material to be cut | SCM440 (HB = 300) | SCM440 (HB = 300) |
| Cutting speed (m/min) | 300 | 300 |
| Feed (mm/rev) | 0.3 | 0.3 |
| Cutting depth (mm) | 2.0 | 1.5 |
| Cutting time (min) | 40 | 40 |

As seen from Table 2, it has been found that the indexable inserts of Examples 1-15 where the A layer is used as the lowermost layer, the alternate layer of the A and B layers is formed on the lowermost layer and the C layer is formed on the alternate layer as the uppermost layer, and the indexable inserts of Examples 16-18 where the B layer is used as the lowermost layer, the alternate layer of the A and B layers is formed on the lowermost layer and the C layer is formed on the alternate layer as the uppermost layer, are significantly reduced in flank wear amount at the cutting edge in both of the continuous and interrupted turning tests, and they each have a considerably long life, compared to the indexable inserts of Comparative Examples 1-3 where neither A layer nor B layer is used for the lowermost layer, and the alternate layer of A and B layers is not formed on the lowermost layer.

It is noted that the "thickness per layer" in Table 1 refers to the thickness of each of the A and B layers constituting the alternate layer. The "thickness" in Tables 1 and 2 refers to the entire thickness of each of the lowermost layer, the alternate layer, the uppermost layer and the coating layer.

Further, the "number of stacked layers" in Table 1 refers to the number of layers of each of the A layer and the B layer included in the alternate layer where the A and B layers are stacked one on another alternately.

Furthermore, the composition of each of the lowermost layer, the alternate layer and the uppermost layer in Tables 1 and 2 was measured using an X-ray photoelectron spectroscopic analysis apparatus (XPS), and the hardness of the entire coating layer was confirmed using a Nano Indenter XP (available from MTS Systems Corporation).

The thicknesses per layer and the thicknesses in Tables 1 and 2 were measured using SEM or TEM, and the compressive residual stress of the entire coating layer in Table 2 was measured with the $\sin^2 \psi$ method using an X-ray residual stress measuring apparatus (see "X-Ray Stress Measurement", The Society of Materials Science, Japan, 1981, Published by Yokendo Co., Ltd., pp. 54-66).

The crystallinity of the entire coating layer in Table 2 was analyzed using an X-ray diffractometer.

Furthermore, the "chipped" in Table 2 means that chipping occurred during the early stage of cutting, which has made a part of the base material missing, where the base material is exposed.

<Drilling Test>

On a drill (JIS K 10 hardmetal) having an outer diameter of 8 mm prepared as a base material, the lowermost layer, the alternate layer and the uppermost layer of each of Examples 1, 7, 12 and Comparative Examples 1 and 2 shown in Tables 1 and 2 were formed in the similar manner as described above, to obtain the drills of Examples 1, 7, 12 and Comparative Examples 1 and 2. Each of the drills of Examples 1, 7, 12 and Comparative Examples 1 and 2 was used to actually perform a drilling test of a material to be processed, SCM 440 (SRC 30), for evaluation of life.

Here, the drilling test was carried out by forming a blind hole of 24 mm in depth, under the conditions of cutting speed of 90 m/min, feed rate of 0.2 mm/rev and using air blow, without the use of cutting oil. The life was determined based on the number of holes obtained until the dimensional accuracy of the processed material became out of a prescribed range. The life evaluation results are shown in Table 4. In Table 4, the greater number of processes shows the longer life.

TABLE 4

| Content of processing | Criterion for determination of life | Ex 1 | Ex 7 | Ex 12 | Com Ex 1 | Com Ex 2 |
|---|---|---|---|---|---|---|
| Drilling test | Number of processes (holes) | 7000 | 7800 | 9100 | 1100 | 1600 |

As seen from Table 4, it has been found that the drills of Examples 1, 7 and 12, where the A layer is used for the lowermost layer, the alternate layer of the A and B layers is formed on the lowermost layer and the C layer is formed on the alternate layer as the uppermost layer, each have a considerably large number of holes produced and hence a considerably long life, compared to the drills of Comparative Examples 1 and 2 where neither A layer nor B layer is formed as the lowermost layer and the alternate layer of the A and B layers is not formed on the lowermost layer.

<End Mill Side-Face Cutting Test>

On a 6-edge end mill (JIS K 10 hardmetal) having an outer diameter of 8 mm prepared as a base material, the lowermost layer, the alternate layer and the uppermost layer of each of Examples 2, 6, 13 and Comparative Example 3 shown in Tables 1 and 2 were formed in the similar manner as described above, to obtain the end mills of Examples 2, 6, 13 and Comparative Example 3. The end mills of Examples 2, 6, 13 and Comparative Example 3 were used to actually carry out a side-face cutting test of a material to be processed, SKD 11 (HRC 60), for evaluation of life.

Here, the side-face cutting test was carried out under the conditions of cutting speed of 200 m/min, feed rate of 0.03 mm/edge, and the amount of cutting of Ad (cutting amount in the axial direction)=12 mm and Rd (cutting amount in the radial direction)=0.2 mm, using air blow and without using cutting oil. The life was determined based on the cut length at the time point when the dimensional accuracy of the processed material became out of a prescribed range. The life evaluation results are shown in Table 5. In Table 5, the longer length when the dimensional accuracy became out of range shows the longer life.

TABLE 5

| Content of processing | Criterion for determination of life | Ex 2 | Ex 6 | Ex 13 | Com Ex 3 |
|---|---|---|---|---|---|
| End mill side-face cutting test | Length when dimensional accuracy became out of range (m) | 180 | 220 | 250 | 18 |

As seen from Table 5, it has been found that the end mill of each of Examples 2, 6 and 13, where the A layer is used for the lowermost layer, the alternate layer of the A and B layers is formed on the lowermost layer and the C layer is formed on the alternate layer as the uppermost layer, exhibits a very long length when the dimensional accuracy became out of the prescribed range and hence has a considerably long life, compared to the end mill of Comparative Example 3 where neither A layer nor B layer is formed as the lowermost layer and the alternate layer of A and B layers is not formed on the lowermost layer.

<Outer Periphery Turning Test>

A pot and a bowl of hardmetal were used to mix powder of binding agent made of 40 mass % of TiN and 10 mass % of Al, with 50 mass % of powder of cubic boron nitride (cBN) having a mean grain size of 2.5 µm, which was filled in a vessel of hardmetal and was sintered at 1400° C. for 60 minutes. The resultant sintered cBN was processed to obtain a tip having a shape of ISO standard SNGA 120408.

On this tip serving as the base material, the lowermost layer, the alternate layer and the uppermost layer in each of Examples 3, 8, 14 and Comparative Example 1 shown in Tables 1 and 2 were formed in the similar manner as described above, to obtain indexable inserts of Examples 3, 8, 14 and Comparative Example 1. The indexable inserts of Examples 3, 8, 14 and Comparative Example 1 were used to actually carry out an outer periphery turning test of a round bar (HRC 62) of SUJ 2, a kind of quenched steel, for evaluation of life.

Here, the outer periphery turning test was carried out under the cutting conditions of cutting speed of 120 m/min, cutting of 0.2 mm, feed of 0.1 mm/rev, in a dry manner for 40 minutes. The life was determined based on measurement of the time (min) elapsed until the surface roughness of the indexable insert was changed from its initial surface roughness (µm) shown in Table 6, corresponding to the surface roughness (Rz) before cutting, to Rz=3.2 µm. The life evaluation results are shown in Table 6. In Table 6, the longer time until Rz becomes 3.2 μm shows the longer life.

TABLE 6

| Content of processing | Criterion for determination of life | Ex 3 | Ex 8 | Ex 14 | Com Ex 1 |
|---|---|---|---|---|---|
| Outer periphery turning test | Initial surface roughness (μm) | 1.32 | 1.23 | 1.23 | 2.22 |
| | Time until Rz becomes 3.2 μm (min) | 77 | 85 | 100 | 13 |

As seen from Table 6, it has been found that the indexable inserts of Examples 3, 8 and 14, where the A layer is formed as the lowermost layer, the alternate layer of the A and B layers is formed on the lowermost layer and the C layer is formed on the alternate layer as the uppermost layer, each take a very long time until Rz becomes 3.2 μm and thus have a considerably long life, compared to the indexable insert of Comparative Example 1 where neither A layer nor B layer is formed as the lowermost layer and the alternate layer of the A and B layers is not formed on the lowermost layer.

<Continuous Turning Test>

On a tip made of hardmetal of a grade of JIS standard S20 and having a shape of JIS standard CNMG 120408 serving as a base material, the lowermost layer, the alternate layer and the uppermost layer of each of Examples 4, 9, 15 and Comparative Examples 2 and 3 shown in Tables 1 and 2 were formed in the similar manner as described above, to obtain the indexable inserts of Examples 4, 9, 15 and Comparative Examples 2 and 3. The indexable inserts of Examples 4, 9, 15 and Comparative Examples 2 and 3 were used to carry out a wet (water soluble emersion) continuous turning test under the conditions as described below. The time when the flank wear amount at the cutting edge exceeds 0.2 mm was measured for evaluation of life.

Here, the continuous turning test was conducted using a Ti alloy, Ti-6Al-4V (HB=310), as a material to be cut, under the conditions of cutting speed of 80 m/min, feed rate of 0.2 mm/rev, and cutting of 1 mm. The life was determined assuming that the longer time until the flank wear amount exceeds 0.2 mm shows the longer life. The life evaluation results are shown in Table 7.

TABLE 7

| Content of processing | Criterion for determination of life | Ex 4 | Ex 9 | Ex 15 | Com Ex 2 | Com Ex 3 |
|---|---|---|---|---|---|---|
| Continuous turning test | Time until flank wear amount exceeds 0.2 mm (min) | 30 | 35 | 45 | 3 | 1 |

As seen from Table 7, it has been found that the indexable inserts of Examples 4, 9 and 15, where the A layer is used for the lowermost layer, the alternate layer of A and B layers is formed on the lowermost layer and the C layer is formed on the alternate layer as the uppermost layer, each take a significantly long time until the flank wear amount exceeds 0.2 mm and thus have a considerably long life, compared to the indexable inserts of Comparative Examples 2 and 3 where neither A layer nor B layer is formed as the lowermost layer and the alternate layer of A and B layers is not formed on the lowermost layer.

Examples 19-21

Indexable inserts of Examples 19-21 having coating layers configured as shown in Tables 8 and 9 below were fabricated in the similar manner as in Examples 1-18, except that the alternate layers were formed in the state where the arc current amount of cathode 106 for the A layer was made greater than that of cathode 107 for the B layer. The values on the column of λa/λb in Table 8 each show the ratio (λa/λb) of the thickness λa of one A layer to the thickness λb of one B layer constituting the alternate layer. It is noted that in Examples 19-21, the A layers within the alternate layer each have the same thickness per layer, and the B layers each have the same thickness per layer.

Each of the indexable inserts of Examples 19-21 was subjected to a dry continuous turning test and a dry interrupted turning test under the conditions shown in Table 3, to measure the flank wear amount at the cutting edge. The life evaluation results are shown in Table 9.

As seen from Table 9, it has been found that the indexable inserts of Examples 19-21, where the B layer is used as the lowermost layer, the alternate layer of the A and B layers is formed on the lowermost layer, the C layer is formed on the alternate layer as the uppermost layer, and the ratio λa/λb of thickness λa of one A layer to thickness λb of one B layer in the alternate layer satisfies $1 \leq \lambda a/\lambda b < 5$, are significantly reduced in flank wear amount at the cutting edge in both of the continuous and interrupted turning tests compared to the indexable inserts of Comparative Examples 1-3. Further, it has been found that the indexable inserts of Examples 19-21 are greatly reduced in flank wear amount at the cutting edge in the continuous turning test even compared to the indexable inserts of Examples 1-18.

TABLE 8

| | | Lowermost layer | | Alternate layer | | | | | | | |
|---|---|---|---|---|---|---|---|---|---|---|---|
| | | | | A layer | | | B layer | | | | |
| | | Composition | Thickness (μm) | Composition | Thickness per layer (μm) | Number of stacked layers | Thickness (μm) | Composition | Thickness per layer (μm) | Number of stacked layers | Thickness (μm) | λa/λb |
| Ex 19 | | $Ti_{0.6}Al_{0.4}N$ | 0.5 | $Al_{0.7}Cr_{0.3}N$ | 0.010 | 190 | 1.9 | $Ti_{0.6}Al_{0.4}N$ | 0.007 | 190 | 1.3 | 1.4 |
| Ex 20 | | $Ti_{0.6}Al_{0.4}N$ | 0.5 | $Al_{0.7}Cr_{0.3}N$ | 0.015 | 150 | 2.3 | $Ti_{0.6}Al_{0.4}N$ | 0.007 | 150 | 1.1 | 2.1 |
| Ex 21 | | $Ti_{0.6}Al_{0.4}N$ | 0.5 | $Al_{0.7}Cr_{0.3}N$ | 0.025 | 100 | 2.5 | $Ti_{0.6}Al_{0.4}N$ | 0.007 | 100 | 0.7 | 3.6 |

TABLE 9

| | Uppermost layer | | Entire coating layer | | | | Flank wear amount (mm) | |
|---|---|---|---|---|---|---|---|---|
| | Composition | Thickness (µm) | Thickness (µm) | Hardness (GPa) | Compressive residual stress (GPa) | Crystallinity | Continuous cutting | Interrupted cutting |
| Ex 19 | $Ti_{0.6}Al_{0.4}C_{0.4}N_{0.6}$ | 0.7 | 4.4 | 43 | 3.8 | cubic | 0.048 | 0.045 |
| Ex 20 | $Ti_{0.6}Al_{0.4}C_{0.4}N_{0.6}$ | 0.7 | 4.5 | 45 | 4.3 | cubic | 0.042 | 0.043 |
| Ex 21 | $Ti_{0.6}Al_{0.4}C_{0.4}N_{0.6}$ | 0.9 | 4.6 | 46 | 5.3 | cubic | 0.039 | 0.041 |

Further, the indexable insert of Example 20 was subjected to the above-described continuous turning test using the same method and under the same conditions as described above. Evaluation of the continuous turning test was made using the same criteria as described above. As a result, it took 65 minutes until the flank wear amount at the cutting edge of the indexable insert of Example 20 exceeded 0.2 mm, and thus, it has been found that the indexable insert of Example 20 is improved in wear resistance compared to the indexable inserts of Examples 4, 9 and 15.

Examples 22-24

Indexable inserts of Examples 22-24 having coating layers configured as shown in Tables 10 and 11 below were fabricated in the similar manner as in Examples 1-18, except that the alternate layers were each formed in the state where the arc current amount of cathode 106 for the A layer was equal to that of cathode 107 for the B layer at the beginning of formation of the alternate layer and then the arc current amount of cathode 106 for the A layer was made continuously greater than that of cathode 107 for the B layer such that the ratio ($\lambda a/\lambda b$) of thickness $\lambda a$ of one A layer to thickness $\lambda b$ of one B layer continuously increases from the side closest to the base material to the side farthest from the base material. The values on the column of "base material side" in Table 10 each show the ratio ($\lambda a/\lambda b$) between thicknesses $\lambda a$ and $\lambda b$ of the A and B layers that are stacked one on the other in the alternate layer at the side closest to the base material. The values on the column of "outermost surface side" in Table 10 each show the ratio ($\lambda a/\lambda b$) between thicknesses $\lambda a$ and $\lambda b$ of the A and B layers that are stacked one on the other in the alternate layer at the side farthest from the base material.

Each of the indexable inserts of Examples 22-24 was subjected to a dry continuous turning test and a dry interrupted turning test under the conditions shown in Table 3, to measure the flank wear amount at the cutting edge. The life evaluation results are shown in Table 10.

As seen from Table 10, it has been found that the indexable inserts of Examples 22-24, where the A layer is used as the lowermost layer, the alternate layer of the A and B layers is formed on the lowermost layer, the C layer is formed on the alternate layer as the uppermost layer, and the ratio $\lambda a/\lambda b$ of thickness ka of one A layer to thickness $\lambda b$ of one B layer in the alternate layer is 1 at the side closest to the base material, it increases as a distance from the base material increases, and satisfies 1<$\lambda a/\lambda b$<5 at the side farthest to the base material, are significantly reduced in flank wear amount at the cutting edge in both of the continuous and interrupted turning tests compared to the indexable inserts of Comparative Examples 1-3. Further, it has been found that the indexable inserts of Examples 22-24 are greatly reduced in flank wear amount at the cutting edge in both of the continuous and interrupted turning tests even compared to the indexable inserts of Examples 1-18. Particularly, it has been found that the indexable inserts of Examples 22 and 23, having the ratio $\lambda a/\lambda b$ of thickness $\lambda a$ of one A layer to thickness $\lambda b$ of one B layer in the alternate layer satisfying 1<$\lambda a/\lambda b$<3 at the side farthest from the base material, are more significantly reduced in flank wear amount at the cutting edge in both of the continuous and interrupted turning tests.

TABLE 10

| | Lowermost layer | | Alternate layer | | $\lambda a/\lambda b$ | |
|---|---|---|---|---|---|---|
| | Composition | Thickness (µm) | A layer Composition | B layer Composition | Base material side | Outermost surface side |
| Ex 22 | $Al_{0.7}Cr_{0.25}Si_{0.05}N$ | 0.5 | $Al_{0.7}Cr_{0.25}Si_{0.05}N$ | $Ti_{0.4}Al_{0.5}Si_{0.1}N$ | 1.0 | 1.5 |
| Ex 23 | $Al_{0.7}Cr_{0.25}Si_{0.05}N$ | 0.5 | $Al_{0.7}Cr_{0.25}Si_{0.05}N$ | $Ti_{0.4}Al_{0.5}Si_{0.1}N$ | 1.0 | 2.0 |
| Ex 24 | $Al_{0.7}Cr_{0.25}Si_{0.05}N$ | 0.5 | $Al_{0.7}Cr_{0.25}Si_{0.05}N$ | $Ti_{0.4}Al_{0.5}Si_{0.1}N$ | 1.0 | 3.0 |

TABLE 11

| | Uppermost layer | | Entire coating layer | | | Flank wear amount (mm) | |
|---|---|---|---|---|---|---|---|
| | Composition | Thickness ($\mu$m) | Thickness ($\mu$m) | Hardness (GPa) | Compressive residual stress (GPa) | Crystallinity | Continuous cutting | Interrupted cutting |
| Ex 22 | $Ti_{0.4}Al_{0.5}Si_{0.1}C_{0.4}N_{0.6}$ | 0.7 | 4.4 | 35 | 3.3 | cubic | 0.052 | 0.025 |
| Ex 23 | $Ti_{0.4}Al_{0.5}Si_{0.1}C_{0.4}N_{0.6}$ | 0.7 | 4.4 | 38 | 3.1 | cubic | 0.042 | 0.021 |
| Ex 24 | $Ti_{0.4}Al_{0.5}Si_{0.1}C_{0.4}N_{0.6}$ | 0.7 | 4.4 | 40 | 3.7 | cubic | 0.047 | 0.038 |

Further, the indexable insert of Example 24 was subjected to the continuous turning test described above using the same method and under the same conditions as described above. Evaluation of the continuous turning test was carried out using the same criteria as described above. As a result, it took 75 minutes until the flank wear amount at the cutting edge of the indexable insert of Example 24 exceeded 0.2 mm, and thus, it has been found that the indexable insert of Example 24 is improved in wear resistance compared to the indexable inserts of Examples 4, 9, 15 and 20.

It is noted that although the coating layers of Examples 1-24 above have been formed by cathode arc ion plating, they may also be formed, e.g., by balanced magnetron sputtering or unbalanced magnetron sputtering.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The coated cutting tool of the present invention can be utilized as a drill, an end mill, an indexable insert for milling, an indexable insert for turning, a metal saw, a gear cutting tool, a reamer, or a tap.

The invention claimed is:

1. A coated cutting tool including a base material and a coating layer formed on a surface of said base material, wherein:
said coating layer includes an alternate layer, in which each of an A layer and a B layer are stacked alternately, the alternate layer including at least two layers of the A layer and at least two layers of the B layer,
said A layer is made of a nitride containing Al and Cr, and when the total number of metal atoms constituting said A layer is represented as 1, a ratio of the number of atoms of said Cr is more than 0 and not more than 0.4,
said B layer is made of a nitride containing Ti and Al, and when the total number of metal atoms constituting said B layer is represented as 1, a ratio of the number of atoms of said Al is more than 0 and not more than 0.7,
in said alternate layer, total thickness of the A layers is not less than 1 $\mu$m and total thickness of the B layers is not less than 0.7 $\mu$m,
when a thickness of said A layer and a thickness of said B layer in said alternate layer are represented as $\lambda a$ and $\lambda b$, respectively, a ratio $\lambda a/\lambda b$ in thickness between said A layer and said B layer satisfies $1 \leq \lambda a/\lambda b < 5$, and
a value of the ratio $\lambda a/\lambda b$ continuously increases as a distance from said base material increases.

2. The coated cutting tool according to claim 1, wherein said B layer contains a Si element, and when the total number of metal atoms constituting said B layer is represented as 1, a ratio of the number of atoms of said Si is more than 0 and not more than 0.2.

3. The coated cutting tool according to claim 1, wherein at least one of said A layer and said B layer contains a V element in an amount of less than 30 atomic %.

4. The coated cutting tool according to claim 1, wherein at least one of said A layer and said B layer contains a B element in an amount of less than 10 atomic %.

5. The coated cutting tool according to claim 1, wherein a lowermost layer of said coating layer is said A layer.

6. The coated cutting tool according to claim 5, wherein said A layer serving as said lowermost layer contains a Si element in an amount of less than 10 atomic %.

7. The coated cutting tool according to claim 1, wherein a lowermost layer of said coating layer is said B layer.

8. The coated cutting tool according to claim 1, wherein an uppermost layer of said coating layer is a C layer, said C layer is made of a carbonitride containing Ti and Al, and when the total number of metal atoms constituting said C layer is represented as 1, a ratio of the number of atoms of said Al is more than 0 and not more than 0.7.

9. The coated cutting tool according to claim 8, wherein said C layer contains a Si element, and when the total number of metal atoms constituting said C layer is represented as 1, a ratio of the number of atoms of said Si is more than 0 and not more than 0.2.

10. The coated cutting tool according to claim 8, wherein said C layer contains a B element in an amount of less than 10 atomic %.

11. The coated cutting tool according to claim 8, wherein said C layer has a thickness of not less than 0.1 $\mu$m and not more than 2 $\mu$m.

12. The coated cutting tool according to claim 1, wherein said coating layer has a total thickness of not less than 0.8 $\mu$m and not more than 15 $\mu$m.

13. The coated cutting tool according to claim 1, wherein said coating layer has compressive residual stress of not less than 0 GPa and not more than 6 GPa.

14. The coated cutting tool according to claim 1, wherein said coating layer has a cubic crystal structure.

15. The coated cutting tool according to claim 1, wherein said base material is made of at least one kind selected from the group consisting of WC-based hardmetal, cermet, high-speed steel, ceramics, sintered cubic boron nitride, sintered diamond, sintered silicon nitride, aluminum oxide, and titanium carbide.

16. The coated cutting too according to claim 1, wherein said coated cutting tool is a drill, an end mill, an indexable insert for milling, an indexable insert for turning, a metal saw, a gear cutting tool, a reamer or a tap.

17. A manufacturing method of the coated cutting tool recited in claim 1, comprising the steps of:
  preparing said base material; and
  forming the alternate layer by alternately stacking at least one layer of each of said A layer and said B layer by physical vapor deposition.

18. The manufacturing method of the coated cutting tool according to claim 17, wherein said physical vapor deposition is at least one kind selected from the group consisting of cathode arc ion plating, balanced magnetron sputtering and unbalanced magnetron sputtering.

19. A coated cutting tool including a base material and a coating layer formed on a surface of the base material, wherein
  said coating layer includes an A layer made of a nitride of $Al_{1-a}Cr_a$, where $0<a\leq0.4$, and a B layer made of a nitride of $Ti_{1-x-y}Al_xSi_y$, where $0<x\leq0.7$, $0\leq y\leq0.2$, $x+y\neq0$,
  at least two layers of said A layer and at least two layers of said B layer are stacked alternately,
  total thickness of the A layers is not less than 1 μm and total thickness of the B layers is not less than 0.7 μm,
  when a thickness of said A layer and a thickness of said B layer in said alternate layer are represented as $\lambda a$ and $\lambda b$, respectively, a ratio $\lambda a/\lambda b$ in thickness between said A layer and said B layer satisfies $1\leq\lambda a/\lambda b<5$, and
  a value of the ratio $\lambda a/\lambda b$ continuously increases as a distance from said base material increases.

20. The coated cutting tool according to claim 19, wherein a lowermost layer of said coating layer is said A layer.

21. The coated cutting tool according to claim 19, wherein an uppermost layer of said coating layer is a C layer made of a carbonitride of $Ti_{1-x-y}Al_xSi_y$, where $0<x\leq0.7$, $0\leq y\leq0.2$, $x+y\neq0$.

22. The coated cutting tool according claim 1, wherein the ratio $\lambda a/\lambda b$ in thickness between said A layer and said B layer satisfies $\lambda a/\lambda b=1$ at a side closest to said base material, and the ratio $\lambda a/\lambda b$ satisfies $1<\lambda a/\lambda b<5$ at a side farthest from said base material.

* * * * *